United States Patent [19]

Sekine

[11] Patent Number: 5,269,693

[45] Date of Patent: Dec. 14, 1993

[54] CONNECTOR FOR PRINTED CIRCUIT BOARDS

[75] Inventor: Yasuharu Sekine, Tokyo, Japan

[73] Assignee: NEC Corporation, Tokyo, Japan

[21] Appl. No.: 980,171

[22] Filed: Nov. 23, 1992

[30] Foreign Application Priority Data

Nov. 25, 1991 [JP] Japan .................................. 3-308633

[51] Int. Cl.⁵ .............................................. H01R 9/09
[52] U.S. Cl. ...................................... 439/74; 439/65; 29/830
[58] Field of Search ....................... 439/44, 45, 47, 60, 439/65, 74, 75; 29/830; 361/380, 412, 413, 417, 419

[56] References Cited

U.S. PATENT DOCUMENTS

| | | | |
|---|---|---|---|
| 3,718,936 | 2/1973 | Rice, Jr. | 29/830 |
| 4,283,755 | 8/1981 | Tracy | 361/413 |
| 4,331,370 | 5/1982 | Andrews et al. | 439/75 |
| 4,450,029 | 5/1984 | Holbert et al. | 29/830 |
| 4,992,908 | 2/1991 | Solomon | 439/65 |

FOREIGN PATENT DOCUMENTS

| | | | |
|---|---|---|---|
| 3423268 | 1/1986 | Fed. Rep. of Germany | 439/65 |
| 300589 | 12/1988 | Japan | 439/74 |

OTHER PUBLICATIONS

Tsui, F.; Louis, H. P.; Schuenemann, C.; Double Board Arrangement; IBM Tech. Disclosure Bulletin, vol. 13, No. 6, Nov. 1970 p. 1141.

Primary Examiner—P. W. Echols
Attorney, Agent, or Firm—Leydig, Voit & Mayer

[57] ABSTRACT

A connector for connecting printed circuit boards includes a stepped member made of an insulating material and having a lower surface and at least two stepped upper surfaces communicated to the lower surface by a plurality of through holes. A plurality of conductive pins are respectively disposed within the through holes. This configuration allows a plurality of printed circuit board members to be affixed to the lower surface and each of the two upper surfaces so that the plurality of conductive pins allows electrical communication therebetween.

9 Claims, 3 Drawing Sheets

CONNECTOR FOR PRINTED CIRCUIT BOARDS

BACKGROUND OF THE INVENTION

The present invention relates to a connector for electrically connecting a plurality of printed circuit boards (PCBs) and, more particularly, to a connector for electrically connecting a plurality of mother boards incorporated in, for example, a cross-connect switch device constituting a node of a synchronous network, asynchronous network or ATM (Asynchronous Transfer Mode) transmission network for individually mounting a plurality of PCBs on each of which a number of electronic parts, e.g., LSIs, are packaged.

Generally, a cross-connect switch device for the above application has a plurality of input switch circuit groups, a plurality of output switch circuit groups (with or without an intermediate switch circuit group, depending on the required cross connecting function), and wiring networks interconnecting the input and output switch circuit groups. A number of electronic parts constituting each of the switch circuit groups and including LSIs are mounted on each of a plurality of PCBs which are in turn mounted on a single mother board. The wiring networks are formed on the surface of the mother board and connected to the PCBs.

Assume that the mother board is affixed to the rear wall of a rack, that the PCBs constituting the input switch groups are mounted on a lower portion of the mother board in parallel with the side walls of the rack (i.e., perpendicular to the ground), and that the PCBs constituting the output switch circuit groups are mounted on an upper portion of the mother board in a horizontal position. Then, the wiring networks provided on the mother board and interconnecting the input and output switch circuit groups are implemented by a number of printed circuits extending in the up-and-down direction without crossing one another.

The mother board of such a cross connect switch device is sometimes divided into a lower mother board for mounting the PCBs assigned to the input switch circuit groups (referred to as input PCBs hereinafter), and an upper mother board for mounting the PCBs assigned to the output switch circuit groups (referred to as output PCBs hereinafter). Then, such two mother boards are connected together by a connector.

The above-mentioned connector is usually implemented as a substantially parallelepiped block made of an insulating material. Such a connector has a surface for connecting to the lower mother board on the front thereof and a surface for connecting to the upper mother board on the rear thereof. A plurality of conductive pins are buried in the connector such that their opposite ends protrude from the front and rear of the connector. The ends of the pins protruding from the front of the connector are passed through through holes formed in the lower mother board and then inserted into contact forming holes located at one edge of the input PCBs. The other end of each pin protruding from the rear of the connector is inserted into a hole formed in the upper mother board and then soldered to a printed circuit which is provided on the mother board.

When the mother board with the input PCBs and the mother board with the output PCBs are connected by the conventional connector, the latter mother board has to have the number of layers constituting the laminate printed circuit thereof increased with the increase in the number of wirings between the input and output switch circuit groups. However, since the number of layers available with the laminate printed circuit is limited, the conventional connector is not practicable when the number of wirings between the input and output switch circuit groups is large.

It is therefore an object of the present invention to provide a connector capable of connecting the input PCBs and output PCBs of a cross-connect switch device without increasing the required number of wirings between input and output switch circuit groups.

SUMMARY OF THE INVENTION

Accordingly, the above objects may be achieved by a printed circuit board connector assembly including a stepped member made of an insulating material and having a lower surface and at least two stepped upper surfaces communicating with the lower surface via a plurality of through holes. A plurality of conductive pins are respectively insertable within the plurality of through holes from the lower surface or the at least two stepped upper surfaces. The plurality of conductive pins are respectively affixed within the plurality of through holes to have a portion of each of the plurality of conductive pins protruding from the lower surface or the at least two stepped upper surfaces. A plurality of printed circuit board members, each being provided with a printed circuit pattern on a surface thereof, are affixed to the lower surface and the at least two stepped upper surfaces and electrically connected to at least some of the plurality of conductive pins.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE INVENTION

Figure 1:
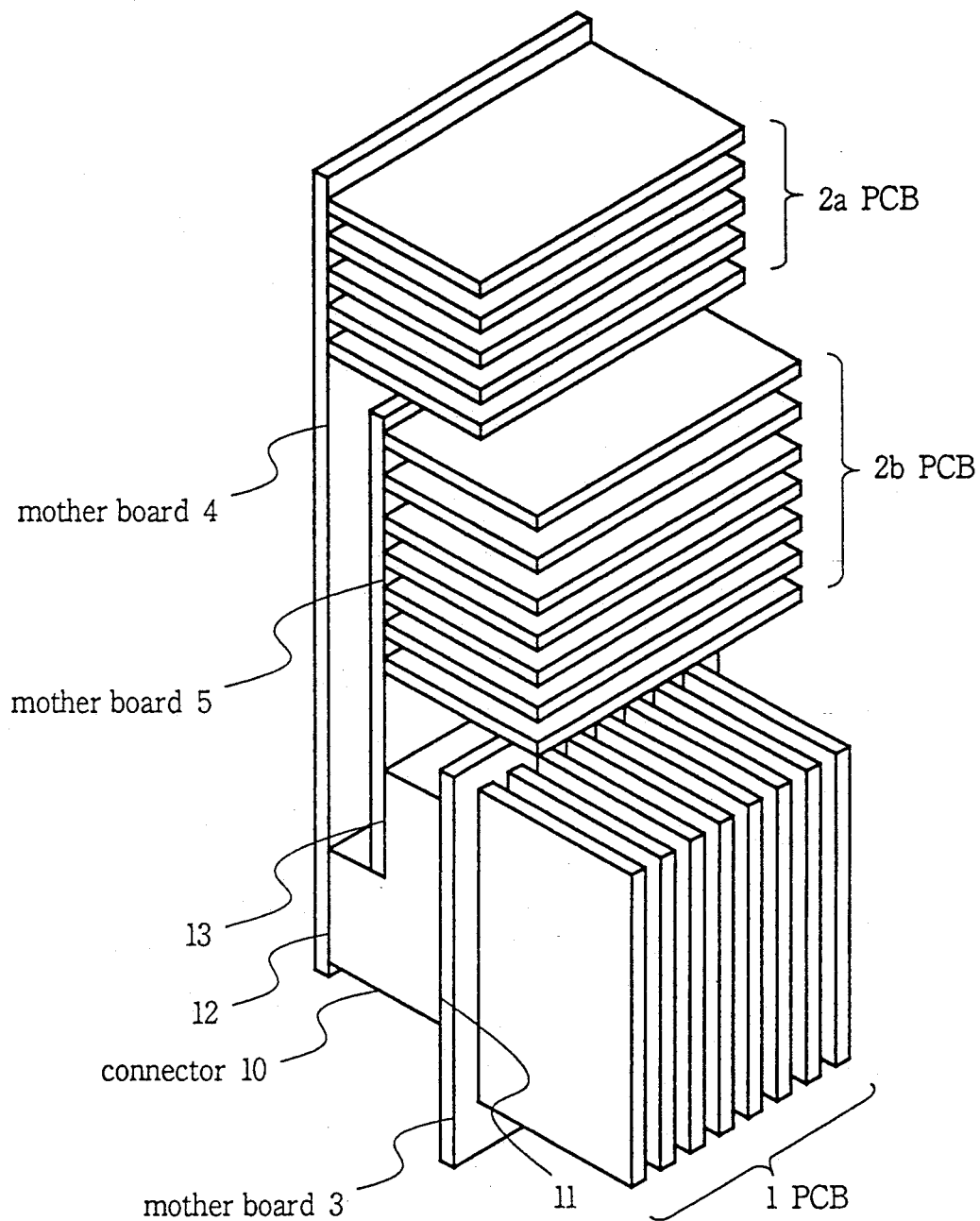
FIG. 1 is a perspective view showing the general arrangement of a cross-connect switch device including a preferred embodiment of the connector in accordance with the present invention.

Referring to FIG. 1 of the drawings, a cross-connect switch device to which the present invention is applicable is shown. As shown, the switch device has mother boards 3, 4 and 5 on the rear wall of a rack thereof, not shown. A PCB connector, not shown, is provided on the surface of each of the mother boards 3, 4 and 5 for mounting a plurality of PCBs. Specifically, a plurality of PCBs 1 are each loaded with a group of input switch circuits and inserted in a particular one of the PCB connectors of the mother board 3 in parallel with the side walls of the rack and perpendicular to the ground. A plurality of PCBs 2a and a plurality of PCBs 2b are respectively inserted in the PCB connectors of the mother boards 4 and 5 in a horizontal position, and each is loaded with a group of output switch circuits.

Figure 2:
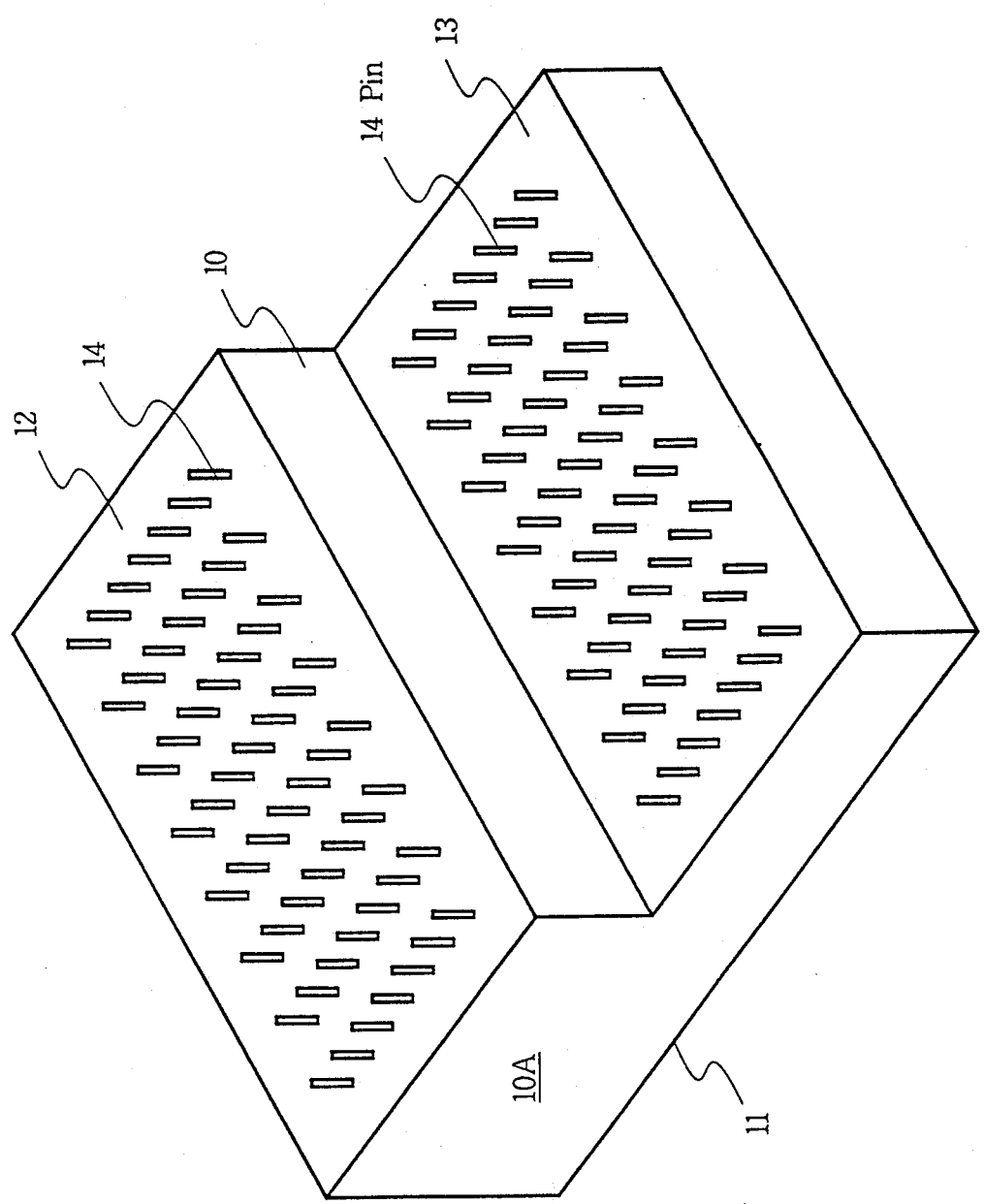
FIG. 2 is a perspective view of the connector shown in FIG. 1.
Figure 3:
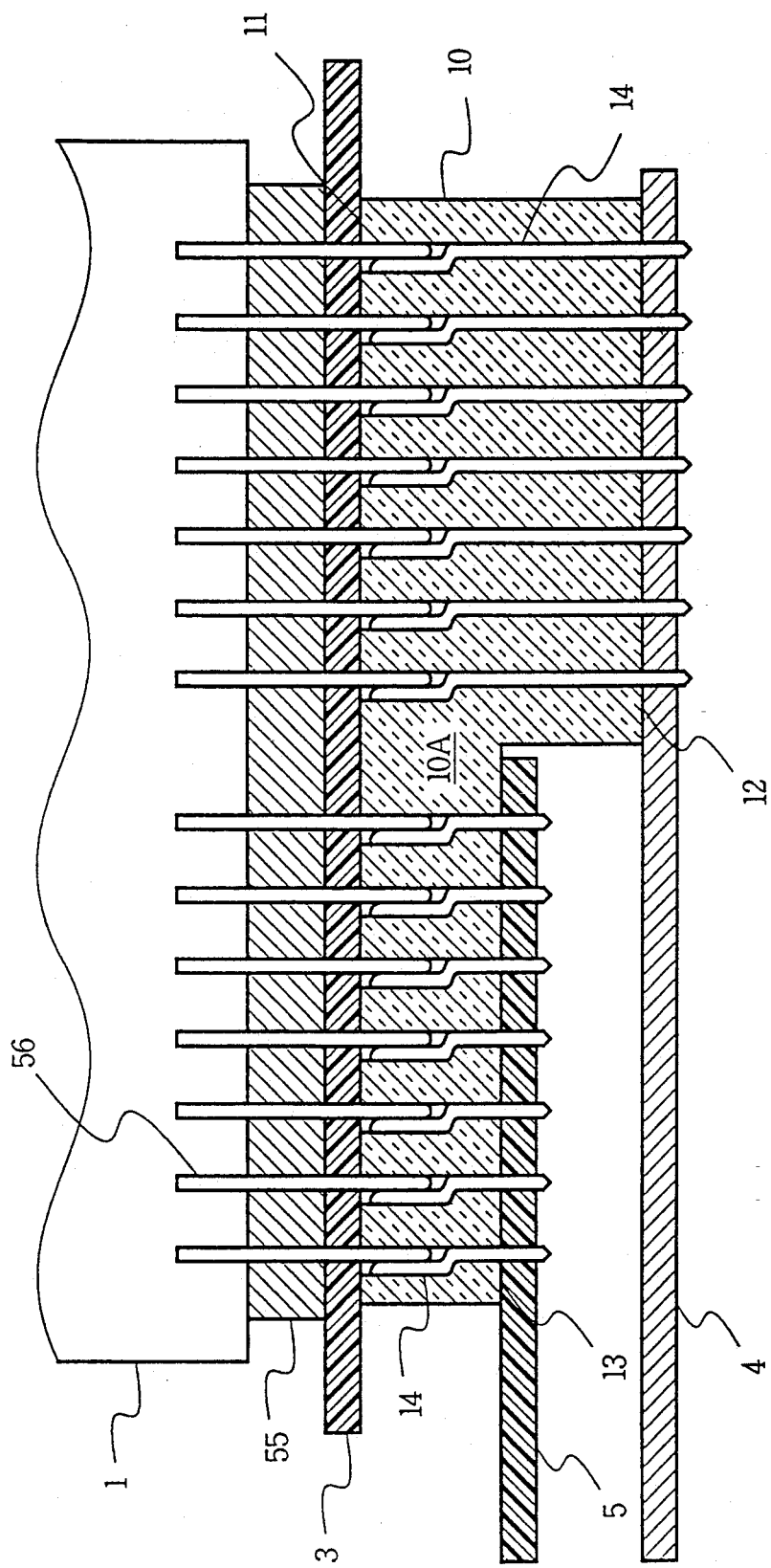
FIG. 3 is a section showing the connector of FIG. 1 and the neighborhood thereof.

Referring also to FIGS. 2 and 3, a stepped connector 10 for connecting the mother boards 3, 4 and 5 as shown in FIG. 1 connects the PCBs 1 on the input side and the PCBs 2a/2b on the output side via printed circuits on the mother board 4/5.

Specifically, as shown in FIGS. 2 and 3, the connector 10 has a stepped member 10A made of an insulating material. The stepped member 10A is formed with a first surface 11 on the bottom thereof, and a second and a third surface 12 and 13 on the top which are configured in steps. The surface 11 receives the mother board 3 while the surfaces 12 and 13 receive the mother boards 4 and 5, respectively. A plurality of through holes are formed in the member 10A. A plurality of conductive pins 14 are each respectively inserted in the through holes from the surface 11 side to protrude from the surface 12 or 13 and inserted into a hole formed in the mother board 4 or 5. The tips of the pins 14 are soldered to printed circuit members, not shown, provided on the surfaces of the mother boards 4 and 5. Part of each of the through holes adjoining the surface 11 of the member 10A is provided with a larger sectional area than the other part to form a larger diameter portion. The tip of each pin 14 adjoining the surface 11 (as shown in FIG. 3) is formed to follow the contour of the larger diameter portions of the through holes. The PCBs 1 are inserted in a PCB connector 55 mounted on the surface of the mother board 3. A plurality of conductive pins 56 extend throughout the PCB connector 55. The plurality of conductive pins 56 are respectively inserted in the holes formed in the member 10A via the associated hole of the mother board 3, whereby they are held in contact with an associated one of the pins 14. The other end of each pin 56 is held in contact with a printed circuit member, not shown, provided on the surfaces of the PCBs 1.

In the illustrative embodiment, the pins 14 each protrudes from the surface 12 or 13 of the connector 10 at one end and remains in the larger diameter portion of the associated through hole of the member 10A at the other end, as stated above. Alternatively, each pin 14 may protrude from the surface 11 and the surfaces 12 and 13 at opposite ends, or it may even remain in the associated through hole at opposite ends thereof. Further, one or both ends of each pin 14 may protrude from the associated surface of the member 10A in a bent configuration and press themselves against the printed circuit member on the PCB surface due to the resiliency of the bend.

Moreover, the member 10A may be provided with a third and a fourth surface on the top thereof in addition to the surfaces 12 and 13. Then, four or more mother boards can be connected by the four surfaces on the top and the single surface on the bottom.

If desired, part or all of the mother boards may be replaced with PCBs for packaging LSIs or similar electronic parts.

Although the invention has been described with reference to a specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

I claim:

1. A printed circuit board connector assembly for connecting printed circuit boards comprising:
   a stepped member made of an insulating material and having a lower surface and at least two stepped upper surfaces communicating with the lower surface via a plurality of through holes; and
   a plurality of conductive pins respectively insertable within the plurality of through holes from one of the lower surface and the at least two stepped upper surfaces and being respectively affixed within the plurality of through holes, and each of the plurality of conductive pins having a portion protruding from at least one of the lower surface and the at least two stepped upper surfaces;
   a plurality of printed circuit board members, each being provided with a printed circuit pattern on a surface thereof, affixed to the lower surface and the at least two stepped upper surfaces and electrically connected to at least some of the plurality of conductive pins.

2. A printed circuit board connector assembly as claimed in claim 1 wherein first ends of the plurality of conductive pins are respectively received from and disposed within first portions of each of the plurality of through holes adjoining the lower surface of the stepped member and second ends of the plurality of conductive pins respectively protruding from at least one of the upper surfaces.

3. A printed circuit board connector assembly as claimed in claim 1 wherein the plurality of printed circuit board members each includes a mother board for mounting a plurality of printed circuit boards on a surface 4. A printed circuit board connector assembly as claimed in claim 1 wherein a first portion of each of the through holes adjoining the lower surface has a larger cross-sectional area than a second portion of each of the through holes adjoining the at least two stepped upper surfaces, a pin extending from at least one of the plurality of printed circuit board members being in contact with at least one of the plurality of conductive pins disposed in the enlarged portion.

5. A printed circuit board connector assembly as claimed in claim 1 wherein another end of each of said conductive pins is connected to a circuit pattern provided on a surface of the printed circuit board member provided on at least one of the at least two stepped upper surfaces.

6. A printed circuit board connector assembly comprising:
   an insulating stepped member having:
      a first planar surface,
      a second planar surface disposed substantially opposed to and spaced from the first planar surface;
      a third planar surface disposed substantially opposed to the first planar surface and spaced from the first and second planar surfaces;
      a plurality of through holes disposed between the first planar surface and the second planar surface and disposed between the first planar surface and the third planar surface, the plurality of through holes each having first and second portions, wherein the first portion has a cross-sectional area larger than a cross-sectional area of the second portion; and
      a plurality of first conductive pins respectively disposed within the plurality of through holes.

7. A printed circuit board connector assembly as recited in claim 6 wherein each conductive pin has first and second portions respectively located in the first and second portions of the through hole, wherein each pin is configured to follow the contour of the respective through holes, and wherein the second portion of the conductive pins extends from the insulating stepped member.

8. A printed circuit board connector assembly as recited in claim 7 including:
   a first mother board disposed adjacent to and substantially in parallel with the first planar surface;
   a second mother board disposed adjacent to and substantially in parallel with the second planar surface and having at least one of the plurality of conductive pins passing therethrough;
   a third mother board disposed adjacent to and substantially in parallel with the third planar surface and having at least one of the plurality of conductive pins passing therethrough;
   a plurality of printed circuit boards disposed adjacent to and orthogonal with the first mother board; and
   a plurality of second conductive pins, affixed to at least one of the plurality of printed circuit boards, disposed through the first mother board and in contact with at least one of the plurality of conductive pins.

9. A printed circuit board connector assembly comprising:
   an insulating stepped member having:
      a first planar surface,
      a second planar surface disposed substantially opposed to and spaced from the first planar surface;
      a third planar surface disposed substantially opposed to the first planar surface and spaced from the first and second planar surfaces;
      a plurality of through holes disposed between the first planar surface and the second planar surface and disposed between the first planar surface and the third planar surface;
   a plurality of first conductive pins respectively disposed within the plurality of through holes;
   a first mother board disposed adjacent to and substantially in parallel with the first planar surface;
   a second mother board disposed adjacent to and substantially in parallel with the second planar surface and having at least one of the plurality of conductive pins passing therethrough;
   a third mother board disposed adjacent to and substantially in parallel with the third planar surface and having at least one of the plurality of conductive pins passing therethrough;
   a plurality of printed circuit boards disposed adjacent to and orthogonal with the first mother board; and
   a plurality of second conductive pins, affixed to at least one of the plurality of printed circuit boards, disposed through the first mother board and in contact with at least one of the plurality of conductive pins.

* * * * *

UNITED STATES PATENT AND TRADEMARK OFFICE
CERTIFICATE OF CORRECTION

PATENT NO. : 5,269,693
DATED : December 14, 1993
INVENTOR(S) : Yasuharu Sekine

It is certified that error appears in the above-indentified patent and that said Letters Patent is hereby corrected as shown below:

Claim 3, column 4, lines 28-29, after "surface" insert --thereof--.

Signed and Sealed this

Twenty-eighth Day of June, 1994

Attest:

BRUCE LEHMAN

*Attesting Officer*  *Commissioner of Patents and Trademarks*